United States Patent
Harris et al.

(10) Patent No.: US 7,068,515 B2
(45) Date of Patent: Jun. 27, 2006

(54) MULTI-CHIP MODULE WITH STACKED REDUNDANT POWER

(75) Inventors: Shaun L. Harris, Mckinney, TX (US); Steven A. Belson, Plano, TX (US); Eric C. Peterson, McKinney, TX (US); Gary W. Williams, Rowlett, TX (US); Christian L. Belady, Mckinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 76 days.

(21) Appl. No.: 10/996,478

(22) Filed: Nov. 24, 2004

(65) Prior Publication Data

US 2006/0109626 A1 May 25, 2006

(51) Int. Cl.
*H05K 7/20* (2006.01)

(52) U.S. Cl. .................... 361/709; 361/692; 361/695; 361/785; 257/707; 257/721; 174/260; 165/80.3; 307/44

(58) Field of Classification Search ........ 361/686–689, 361/692–697, 700–712, 761, 783–791, 772, 361/773, 774, 808–809; 257/706, 707, 713, 257/715, 718–719, 721, 735, 737, 690–697; 174/52.1, 59, 60, 260, 261; 165/80.2, 80.3, 165/165, 185; 307/43, 44, 69, 65, 112, 116, 307/125, 139, 140
See application file for complete search history.

(56) References Cited

U.S. PATENT DOCUMENTS

| | | | |
|---|---|---|---|
| 5,181,167 A * | 1/1993 | Davidson et al. ........... 361/699 |
| 5,986,887 A * | 11/1999 | Smith et al. ................ 361/704 |
| 6,304,450 B1 * | 10/2001 | Dibene et al. .............. 361/704 |
| 6,356,448 B1 * | 3/2002 | DiBene et al. .............. 361/721 |
| 6,452,804 B1 * | 9/2002 | Dibene et al. .............. 361/720 |
| 6,556,455 B1 * | 4/2003 | Dibene et al. .............. 361/785 |
| 6,623,279 B1 * | 9/2003 | Derian et al. ................. 439/74 |
| 6,697,257 B1 * | 2/2004 | Wolf et al. ................. 361/708 |
| 6,807,058 B1 * | 10/2004 | Matteson et al. ........... 361/700 |
| 6,819,562 B1 * | 11/2004 | Boudreaux et al. ......... 361/690 |
| 6,979,784 B1 * | 12/2005 | Duley ........................ 174/260 |
| 7,005,586 B1 * | 2/2006 | Duley ........................ 174/261 |
| 2002/0176229 A1 * | 11/2002 | Derian et al. ............... 361/704 |
| 2003/0162442 A1 * | 8/2003 | Panella ....................... 439/608 |
| 2003/0198033 A1 * | 10/2003 | Panella et al. .............. 361/760 |
| 2005/0078463 A1 * | 4/2005 | Chheda et al. .............. 361/789 |

* cited by examiner

Primary Examiner—Michael Datskovskiy

(57) ABSTRACT

Embodiments include apparatus, methods, and systems having a multi-chip module with stacked redundant power. An exemplary apparatus has a module having plural processors. A first power system is coupled, in a vertically stacked configuration, to the module for providing power to the module. A second power system provides power to the module and is coupled, in a vertically stacked configuration, to the first power system. Each power system serves as a duplicate for preventing failure of the module upon failure of one of the power systems. A thermal dissipation device is disposed between both the first and second power systems and the first power system and module such that the thermal dissipation device dissipates heat, via heat exchange, away from the processors, the first power system, and the second power system.

20 Claims, 7 Drawing Sheets

MULTI-CHIP MODULE WITH STACKED REDUNDANT POWER

BACKGROUND

Some electronic systems utilize several printed circuit boards with many different electronic components interconnected to the circuit boards. As these electronic systems decrease in size and increase in performance, packing density, heat dissipation, and power distribution architecture become increasingly important.

As noted, packing density is one important criterion in many electronic systems. One way to reduce the actual size of an electronic device is to more closely position the electrical components together. Electrical components within a circuit board, however, are generally already tightly confined, and additional space may not be readily available. If, however, electrical components can be positioned to reduce the overall size of the electronic device, then significant savings and advantages can be realized.

Heat dissipation is also an important criterion in many electronic systems. Circuit boards may include a plurality of heat-generating devices that must be cooled in order to operate within a specified operating temperature. If these heat-generating devices are not sufficiently cooled, then the devices can exhibit a decrease in performance or even permanently fail.

As processor and memory technologies advance, power distribution architecture concurrently must evolve to meet demands of processors and memories. Designers consider many factors when developing power distribution architectures for electronic systems. For instance, one important consideration is supplying reliable power to processor circuit boards. If a power converter fails, for example, then power to an entire circuit board can be lost.

The design and layout of printed circuit board components can be quite complex and challenging. Designers must consider many important factors, such as packing density, heat dissipation, and power distribution architecture. Improvements in these areas can realize important benefits for electronic systems and devices.

SUMMARY

Embodiments in accordance with the present invention are directed to apparatus, methods, and systems for providing a multi-chip module with stacked redundant power. In one exemplary embodiment, an apparatus has a module having plural processors. A first power system is coupled, in a vertically stacked configuration, to the module for providing power to the module. A second power system provides power to the module and is coupled, in a vertically stacked configuration, to the first power system. Each power system serves as a duplicate for preventing failure of the module upon failure of one of the power systems. A thermal dissipation device is disposed between both the first and second power systems and the first power system and module such that the thermal dissipation device dissipates heat, via heat exchange, away from the processors, the first power system, and the second power system.

In another exemplary embodiment, a method comprises connecting, in a stacked configuration, plural redundant power system boards, such that a space between the power system boards includes a first thermal dissipation device; connecting, in a stacked configuration, the power systems boards to a module having multiple integrated circuit chips, such that a space between one of the power system boards and the module includes a second thermal dissipation device; dissipating heat from both power system boards with the first thermal dissipation device; and dissipating heat from the integrated circuit chips with the second thermal dissipation device.

Other embodiments and variations of these embodiments are shown and taught in the accompanying drawings and detailed description.

DETAILED DESCRIPTION

Figure 1:
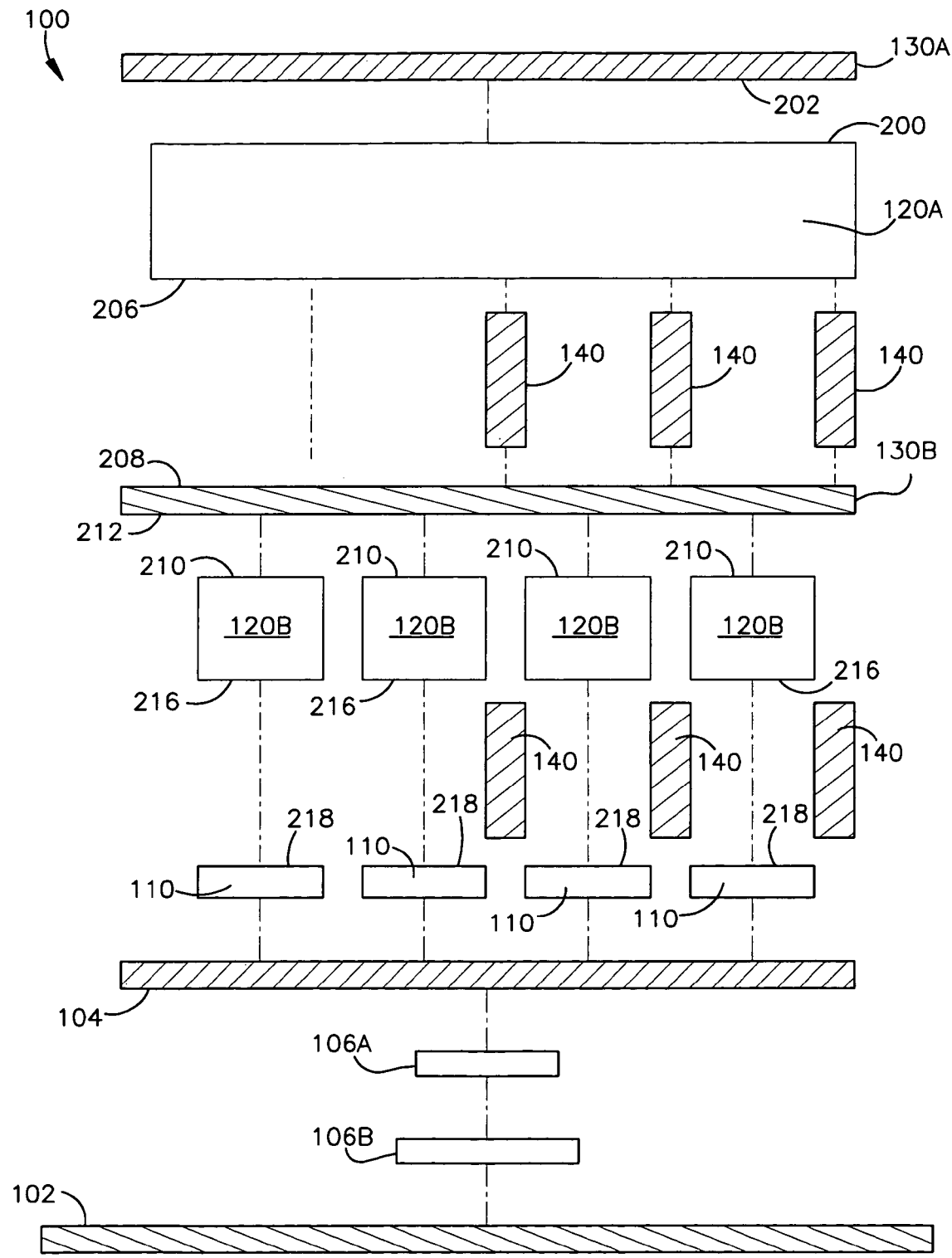
FIG. 1 is an exploded side view of a block diagram of an electronic assembly in accordance with an exemplary embodiment of the present invention.

FIGS. 1–6 show an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, ICs, modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connectors 106A and 106B, for example, can be used to electrically couple the PCB 102 to the PCB 104. Connectors 106 provide a mechanical and electrical interface or connection between the PCBs and may include, for example, a removably connectable plug (male) and socket (female). Alternatively, a single connector can be used to connect the PCBs 102 and 104.

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, integrated circuits (ICs) or chips, digital memory chips, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 can also include a plurality of electronic components or device that may or may not generate heat, that may generate low or insignificant amounts of heat, or that may generate heat but not require the generated heat to be thermally dissipated from the device for the device to operate properly or within a specified temperature range. Examples of such devices include, but are not limited to, resistors, capacitors, transistors, diodes, memories, etc.

The electronic assembly 100 includes plural thermal solutions or thermal dissipation devices 120A, 120B. The thermal dissipation devices include, but are not limited to, heat spreaders, cold plates or thermal-stiffener plates, refrigeration (evaporative cooling) plates, heat pipes, mechanical gap fillers (including plural pins, rods, etc.) thermal pads, or other devices adapted to dissipate heat. Further, thermal dissipation devices include thermal compounds and thermal interface material that can be used to form a thermally conductive layer on a substrate, between electronic components, or within a finished component. For example, thermally conductive resins, tapes, molded thermoplastic compounds, adhesives and greases can be used between a heat-generating device and thermal dissipating device to improve heat dissipation and/or heat transfer. Further, thermal dissipation devices include heatsinks. A heatsink is a component designed to reduce the temperature of a heat-generating device or component, such as heat-generating components 110. A heatsink, for example, can dissipate heat in a direct or indirect heat exchange with the electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, thermal dissipation devices, including heatsinks, can utilize various liquids and/or phase change material.

The electronic assembly 100 also includes multiple power supplies or power systems 130A, 130B. Electrical connectors or power coupling devices 140 connect the respective power system 130A, 130B to the PCB 104.

The power systems 130A, 130B can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC—DC converter, AC-DC converter, DC linear regulator, DC switching regulator, or DC charge pump.

Figure 2:
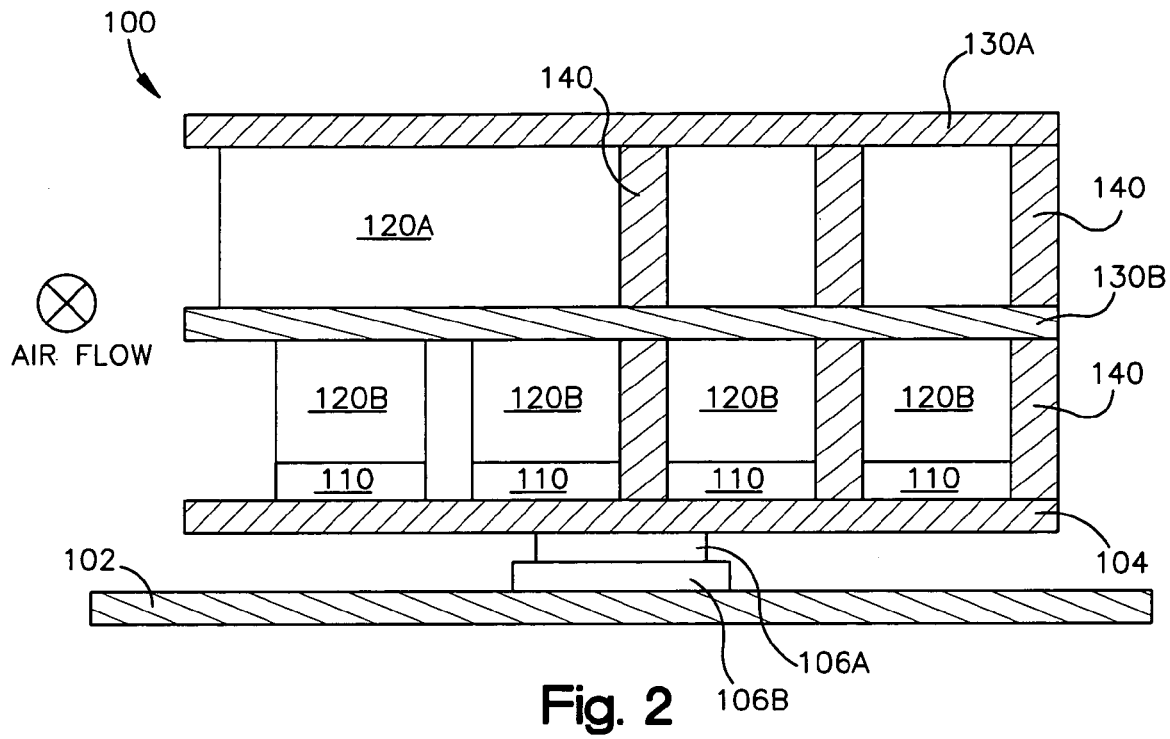
FIG. 2 is a side view of the electronic assembly of FIG. 1 with the electronic assembly being assembled together.

The power systems 130A, 130B can be configured as PCBs, power module assemblies, power circuit cards/boards, and/or power module PCBs. As best shown in FIG. 2, the power systems 130A, 130B are disposed adjacent each other in a parallel and vertically stacked relationship. The power systems are separated by a distance equivalent to about the thickness of thermal dissipation device 120A.

The two powers systems 130A, 130B may be redundant power systems. Redundant power systems can serve as a duplicate for preventing failure upon failure of one of the power systems. In other words, if one power system fails, then the other power system can supply sufficient power to the system to continue operation of the system. As an example, if power system 130A fails, then power system 130B could provide sufficient power to the PCB 104 and corresponding heat-generating components 110. Alternatively, if power system 130B fails, then power system 130A could provide sufficient power to the PCB 104 and corresponding heat-generating components 110. Further, each power system 130A, 130B can provide power to a single device or component (such as a single PCB or single heat-generating component) or multiple devices or components (such as multiple PCBs or multiple heat-generating components). For example, one power system could provide power to a first processor on PCB 104, and a second power system could provide power to a second processor on PCB 104.

The two power systems 130A, 130B may also be modular and replaceable. In some embodiments, each power system 130A, 130B is an independently-operable unit or module that can be constructed with standardized units or dimensions for flexibility and replaceability for use in the electronic assembly 100. Further, each power system 130A, 130B can be connected to or removed from the electronic assembly (example, the PCB 104) without connecting, removing, or replacing other components in the electronic assembly 100 (example, the heat-generating components 110). By way of illustration, suppose for example that power system 130B fails or otherwise needs replaced or upgraded. The power systems 130A, 130B can be disconnected and removed from the PCB 104 without removing or replacing the thermal dissipation devices 120B, the heat-generating components 110, and/or the PCBs 102 and 104. As another illustration, suppose for example that power system 130A fails or otherwise needs replaced or upgraded. The power system 130A can be disconnected and removed from the power system 130B without removing or replacing the power system 130B, the thermal dissipation devices 120A, 120B, the heat-generating components 110, and/or the PCBs 102 and 104.

Once connected, the PCB 102 is generally parallel to the PCB 104. The PCBs 102 and 104 are mechanically and electrically connected to form a vertical stacked-up configuration. In particular, the connectors 106A and 106B couple the PCBs together.

Figure 3:
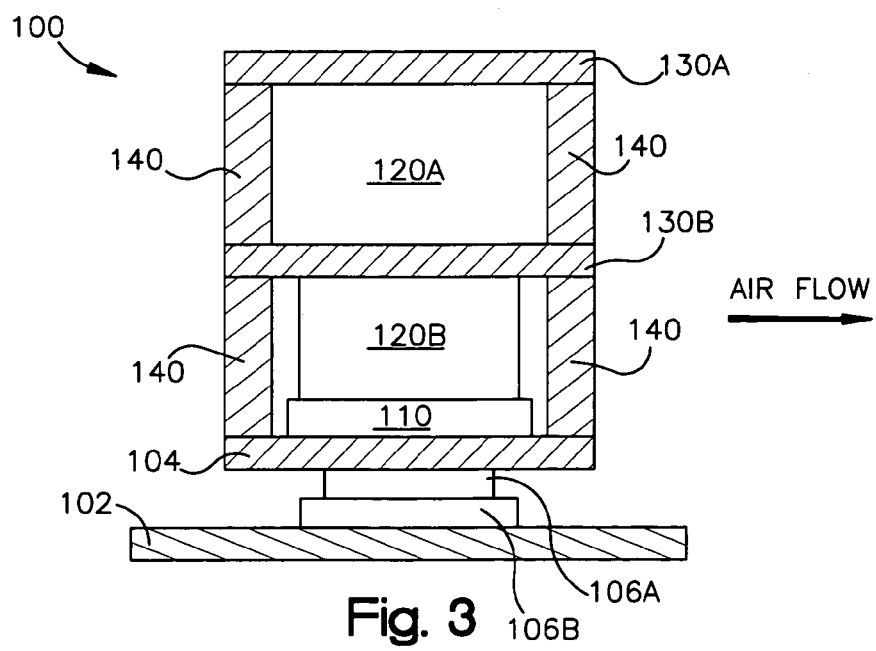
FIG. 3 is an end view of FIG. 2.
Figure 4:
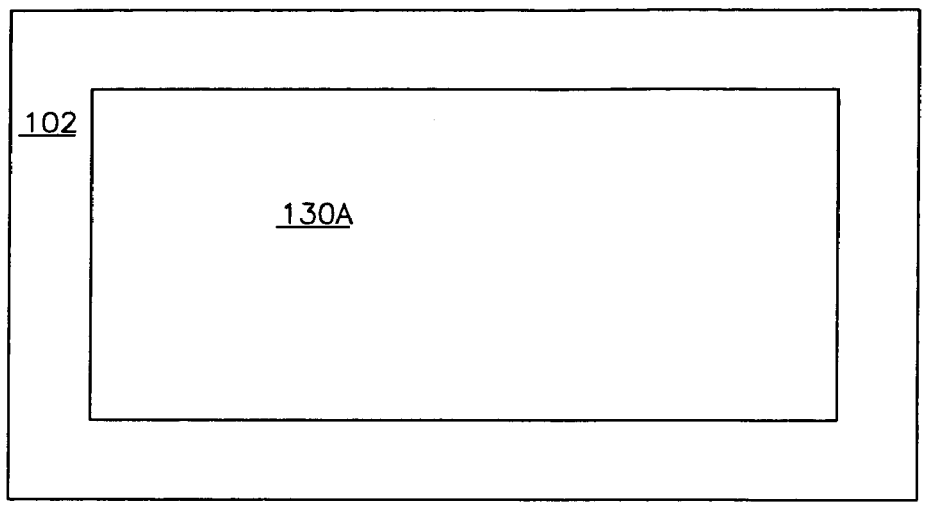
FIG. 4 is a top view of FIG. 2.
Figure 5:
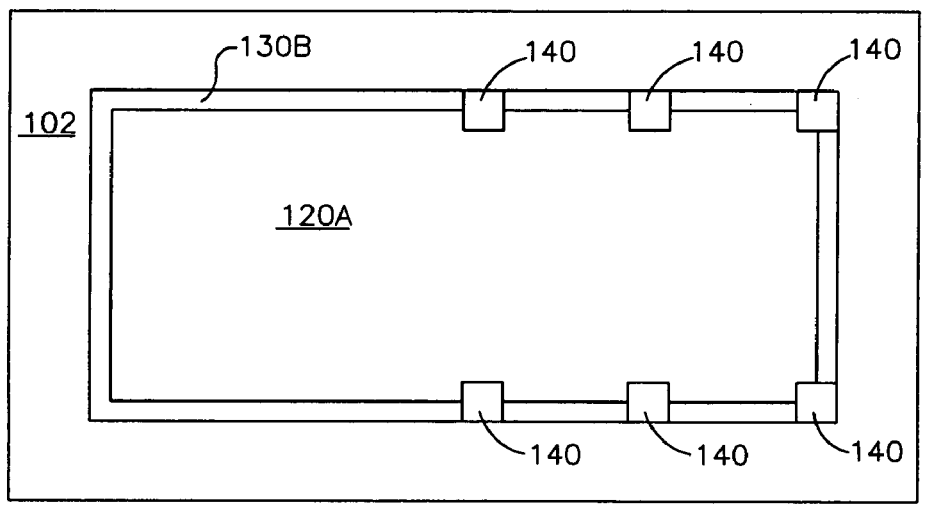
FIG. 5 is a top view of the FIG. 2 with the power system removed from the electronic assembly.
Figure 6:
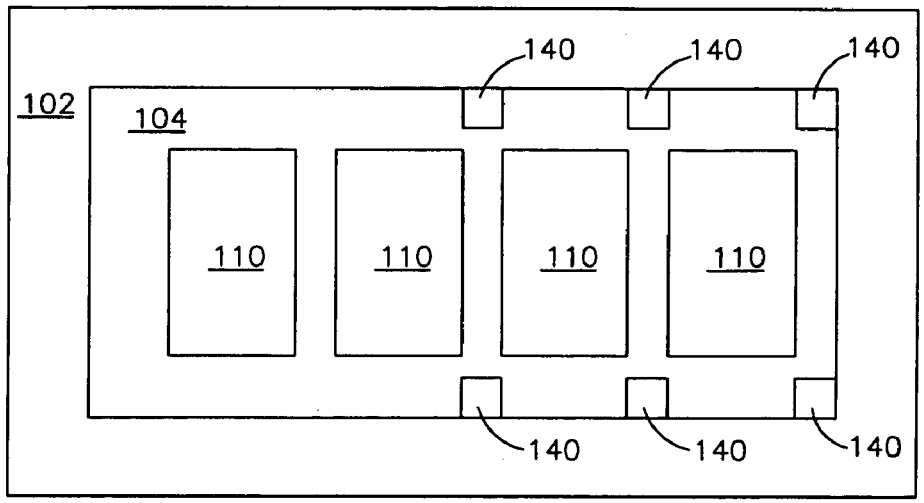
FIG. 6 is a top view of FIG. 2 with two layers of power systems and two layers of thermal dissipation devices removed from the electronic assembly.

As best shown in FIGS. 2 and 3, the electronic assembly 100 comprises four different vertically stacked layers. A first layer includes the PCB 102; a second layer includes the PCB 104; a third layer includes the power system 130B; and a fourth layer includes the power system 130A. Thermal dissipation device 120B is disposed between the second and third layers, and thermal dissipation device 120A is disposed between the third and fourth layers. In one exemplary embodiment, the thermal dissipation device 120A substantially fills a volume of space that is created between the power system 130A and power system 130B. In another exemplary embodiment, the thermal dissipation device 120B substantially fills a volume of space that is created between the power system 130B and heat-generating components 110 of PCB 104.

The thermal dissipation devices 120A, 120B can directly or indirectly attach or contact various layers and/or electrical components. Looking to FIGS. 1 and 2, the thermal dissipation device 120A has a top surface 200 that contacts or is adjacent to a bottom surface 202 of power system 130A. A bottom surface 206 of thermal dissipation device 120A contacts or is adjacent to a top surface 208 of power system 130B. Further, the thermal dissipation device 120B has a top surface 210 that contacts or is adjacent to a bottom surface 212 of power system 130B. A bottom surface 216 of thermal dissipation device 120B contacts or is adjacent to top surfaces 218 of heat-generating components 110.

The thermal dissipation devices 120A, 120B can utilize a remote heat exchanger (RHE). An RHE enables the thermal dissipation device to be remote from the heat-generating device (such as PCB 104, heat-generating components 110, and/or power systems 130A, 130B). For example, heat can be transferred from the heat-generating device to an attachment block having a heat pipe. The heat pipe, for instance, can be a hollow copper pipe containing a fluid and wicking material. Through a process of vaporization and re-condensation, heat travels through the heat pipe to a heat exchanger, such as a finned heat sink. Localized airflow can be used to evacuate the heat to the environment.

As shown in FIG. 1, thermal dissipation device 120A comprises a unitary or single member, and thermal dissipation device 120B comprises a plurality of individual, separate members. Embodiments in accordance with the invention, though, can utilize a wide variety of types and number of thermal dissipation devices. For example, thermal dissipation device 120A can comprise a plurality of individual, separate members, as opposed to a unitary or single member. Further, the thermal dissipation device 120B can comprise a unitary or single member, as opposed to a plurality of individual, separate members. Some examples of these variations are shown and discussed in connection with FIGS. 9–11.

The thermal dissipation device 120A and/or 120B can be an active device that produces an airflow. For purposes of illustration only, the electronic assembly 100 is shown with an airflow direction as indicated with arrows in FIGS. 2 and 3 (the airflow being into the page and indicated with a circle and "X" in FIG. 2). The airflow can be provided, for example, with a fan or other device positioned within the electronic assembly 100 or within the thermal dissipation device 120A, 120B. The airflow is directed in a pathway that is parallel to the PCBs 102 and 104 and power systems 130A, 130B. A primary airflow can thus be directed at, above, or below the PCB 104, the heat-generating components 110, the power systems 130A, 130B, and/or the thermal dissipation devices 120A, 120B. Further, the primary airflow can be simultaneously directed to several different components/layers (such as the PCB 104, the heat-generating components 110, the power systems 130A, 130B, and/or the thermal dissipation devices 120A, 120B) or exclusively at individual components/layers. Thus, the same airflow can be used to cool or dissipate heat simultaneously from multiple layers and/or components or solely from a single layer and/or component.

As shown in FIGS. 2–6, a single thermal dissipation device 120A, 120B can be used to dissipate heat from several different heat generating devices. For example, thermal dissipation device 120A is sandwiched between power systems 130A and 130B. In this configuration, thermal dissipation device 120A simultaneously dissipates heat away from both power systems 130A, 130B. Likewise, thermal dissipation device 120B is sandwiched between power system 130B and heat-generating components 110. In this configuration, thermal dissipation device 120B simultaneously dissipates heat away from both power system 130B and heat-generating components 110. The configuration or arrangement of electronic components and/or layers shown in the figures saves weight, space, and money since the components and/or layers are efficiently spaced and additional thermal dissipation devices are not required.

As best shown in FIGS. 2 and 3, the connectors 140 are vertically stacked so connectors at one layer or level are directly above or below connectors at an adjacent layer or level. In this configuration, electrical connection can be established from power systems 130A, 130B to PCB 104 and heat-generating components 110.

Figure 7:
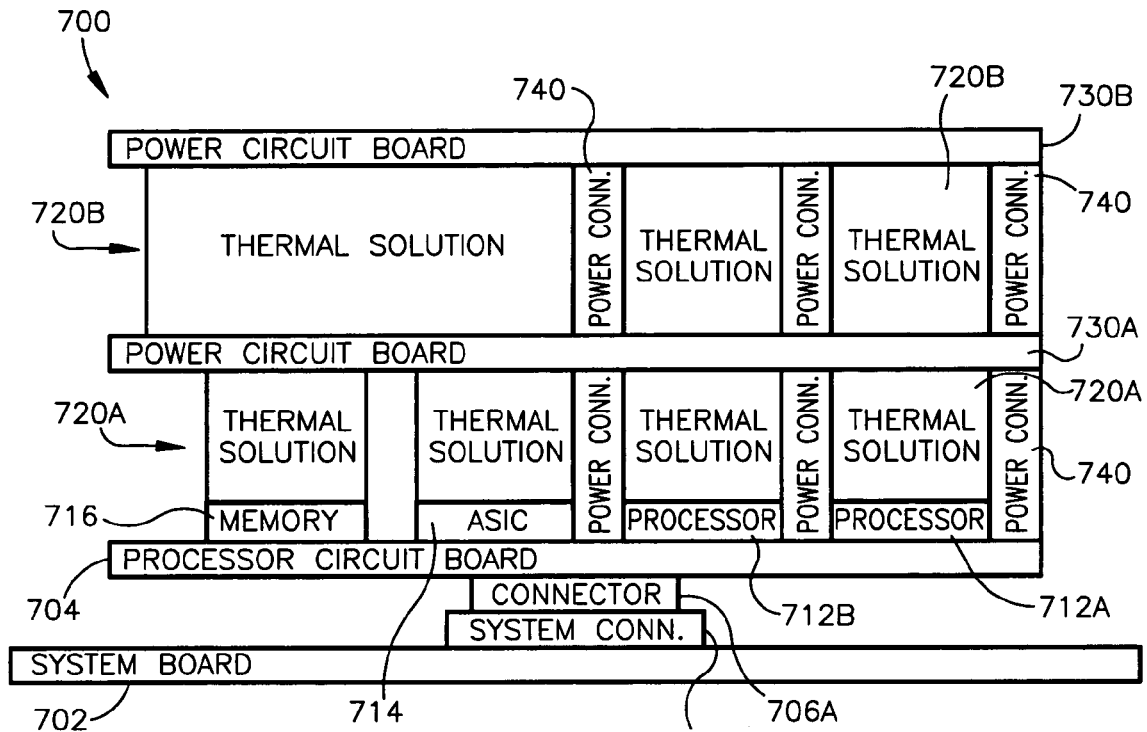
FIG. 7 is a side view of an exemplary embodiment of an electronic assembly.
Figure 8:
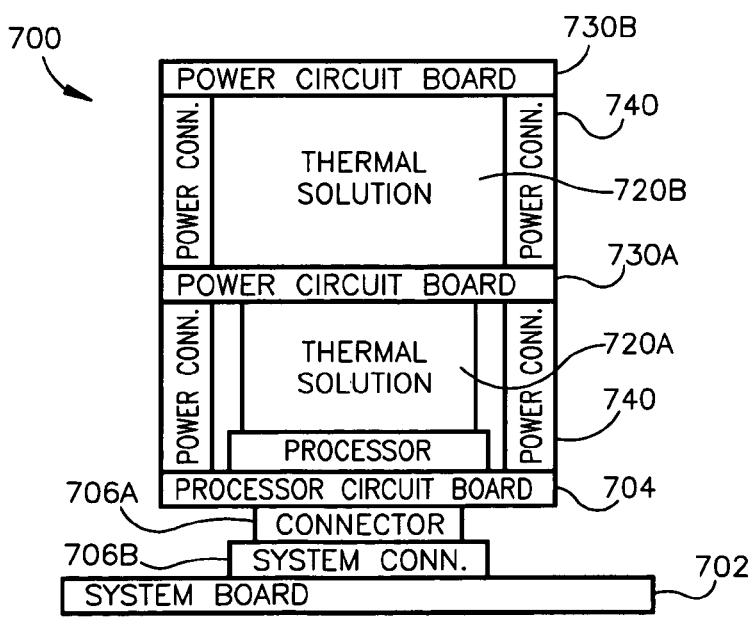
FIG. 8 is an end view of FIG. 7.

Various different electronic components, layers, and PCBs can be combined into different embodiments in accordance with the invention. FIGS. 7 and 8 illustrate one such exemplary embodiment as electronic assembly 700. In this figure, a system board 702 connects to a processor circuit board 704 with a processor connector 706A and a system connector 706B. The processor circuit board 704 can include (among other electrical components) processors, memories, and ASICs. For example, the processor circuit board 704 can have numerous electronic heat-generating components, such as two processors 712A and 712B, an ASIC 714, and memory 716, to name a few examples. A first layer of thermal solution 720A is positioned directly above the processor circuit board 704 to cool and dissipate heat, via direct heat exchange, for the processors 712A, 712B, ASIC 714, and memory 716. A first power circuit board 730A is above the thermal solution 720A. The thermal solution 720A can cool and dissipate heat, via direct heat exchange, for the power circuit board 730A. A second layer of thermal solution 720B is positioned directly above the power circuit board 730A and directly below the power circuit board 730B to cool and dissipate heat, via direct heat exchange, for the power circuit boards 730A, 730B. Electrical connectors 740 couple or connect the two power circuit boards 730A, 730B to the processor circuit board 704. The power circuit boards 730A, 730B can include power controls that can, for example, provide power control functionality for the power circuit boards.

Embodiments in accordance with the present invention can utilize a modular connective architecture. If a particular electronic component (including PCBs) or device fails or otherwise needs to be replaced, the electronic component can be removed from the electronic assembly and replaced with a new and/or different component. As such, the electronic assemblies can be constructed with standardized electronic components and/or dimensions to enable flexibility and variety of use and exchange of components. Looking to FIG. 7 as an example, if power circuit board 730B fails or needs to be replaced, the power circuit board 730B can be disconnected or uncoupled from the power connectors 740 and removed from the electronic assembly 700 while the power circuit board 730A, processor circuit board 704, and system board 702 remain mechanically connected. A new and/or different power circuit board can thereafter be connected to the connectors 740 and utilized with the electronic assembly 700.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

Embodiments in accordance with the present invention can utilize a variety of modules. As an example, looking to FIGS. 2 and 3, the PCB 104 can be a processor module that includes heat-generating components 110 (such as two separate processors, an ASIC, and memory all on the same board or card). As another example, the two power systems 130A, 130B can connect together to form a power system module. The power system module can comprise first and second power system boards or cards vertically stacked and connected or coupled together with connectors 140. The thermal dissipation device 120A can be disposed or sandwiched between the power boards. Together, the power boards, connectors, and thermal dissipation device form a module that can be removably connected to, for example, the processor module. As yet another example, the processor module and power module can be connected together to form a power/processor module. FIGS. 2 and 3, for example, show such a module connected, via connectors 106A and 106B, to PCB 102.

In order to facilitate modularity within the electronic assembly, various removable connections between electronic components can be utilized. By way of example, such connections include, but are not limited to, land grid arrays (LGAs), pin grid arrays (PGAs), plugs (example, male), sockets (example, female), pins, connectors, soldering, or other removable or disconnectable attachments.

Embodiments in accordance with the invention are not limited to two power systems 130A, 130B vertically stacked on a single PCB 104. For example, more than two power systems or power modules can be vertically stacked on the PCB 104. Alternatively, more than one PCB 104 having plural vertically stacked power systems can be mechanically and electrically coupled to a single PCB 102. For example, several power/processor modules can be vertically stacked on top of each other. Further yet, modules can be positioned adjacent each other. For example, plural power/processor modules can be horizontally stacked adjacent each other on PCB 102.

Figure 9:
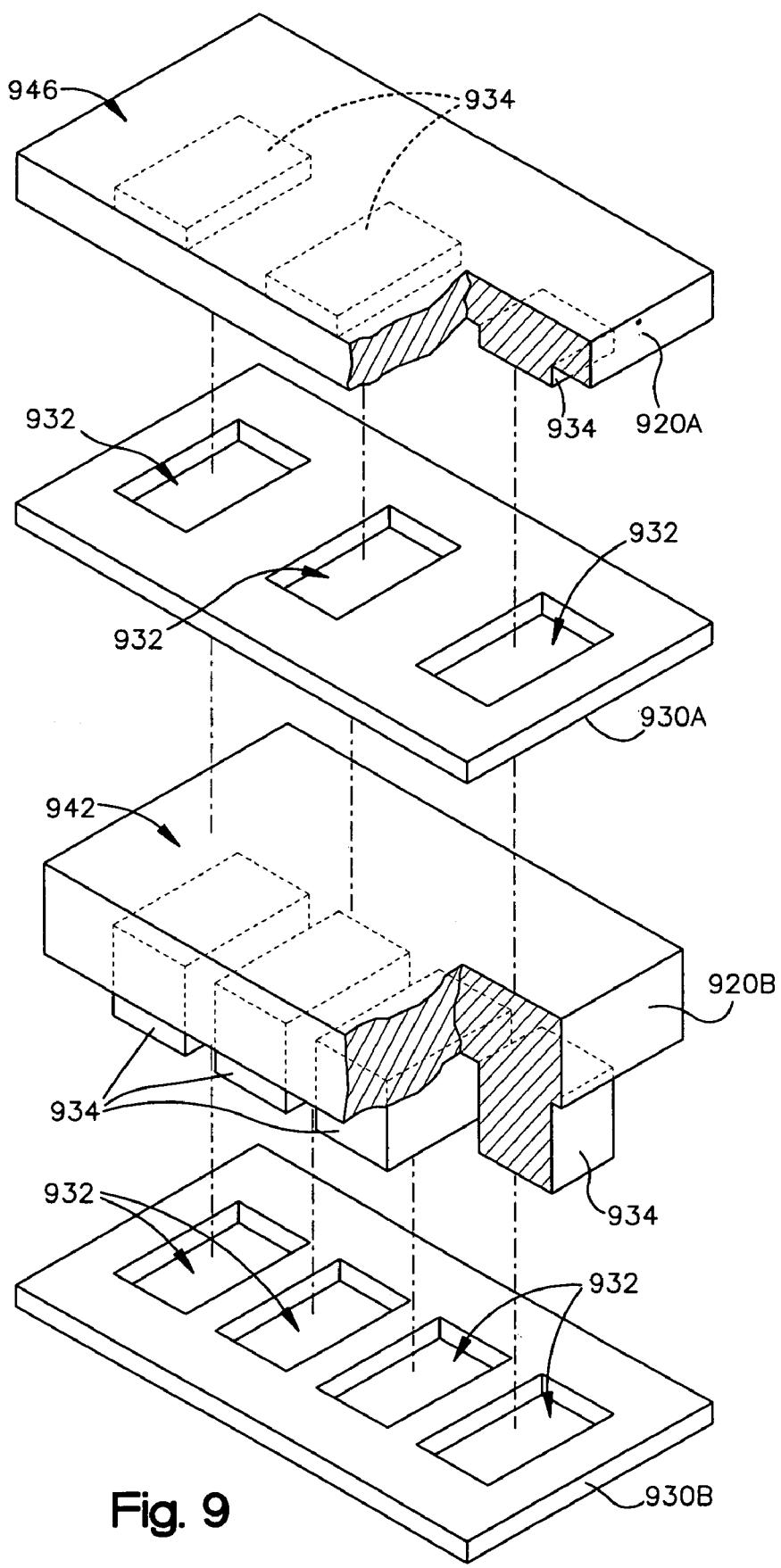
FIG. 9 is an exploded perspective view of two power systems and two thermal dissipation devices vertically stacked.
Figure 10:
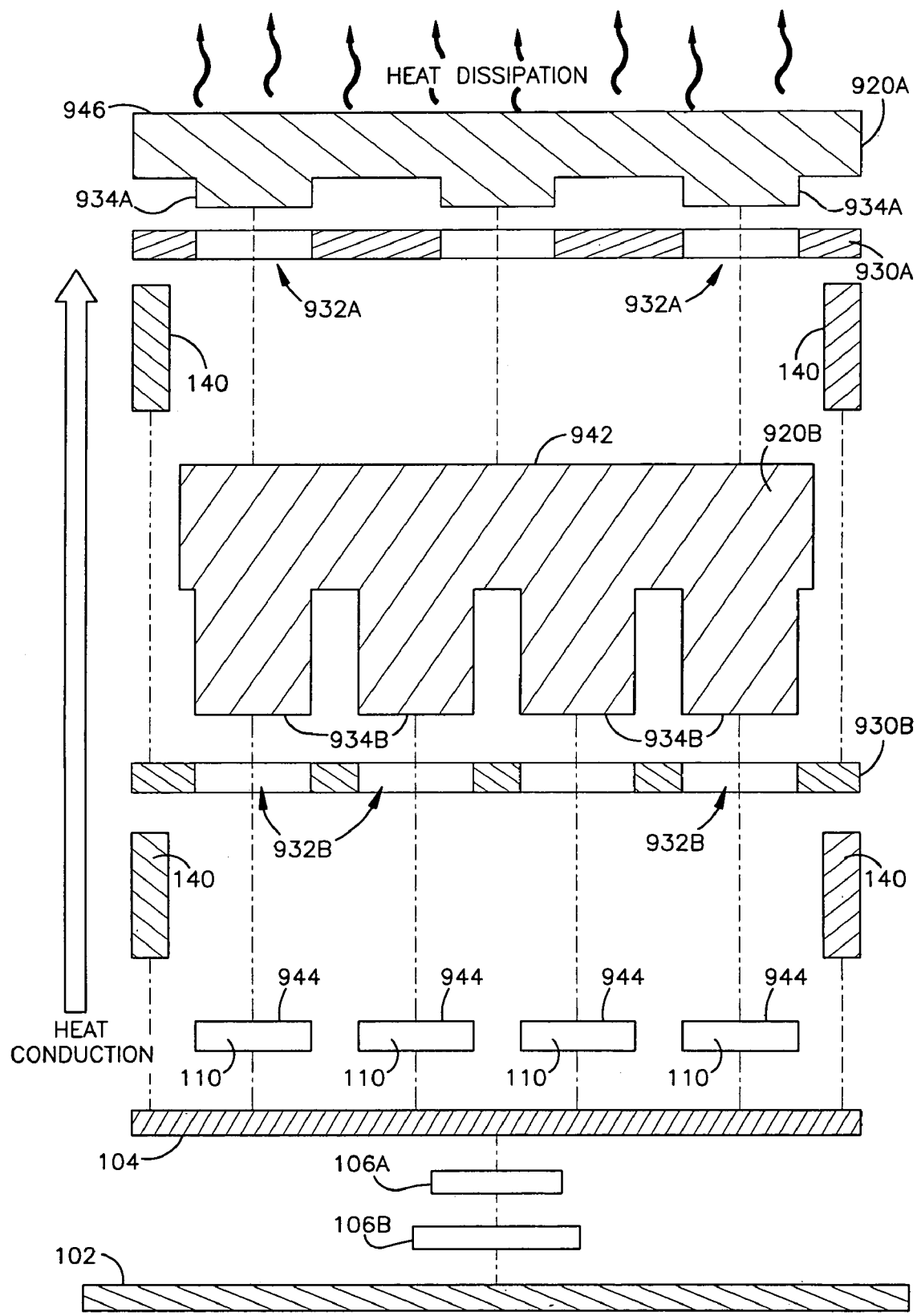
FIG. 10 is an exploded side view of an exemplary embodiment of an electronic assembly.
Figure 11:
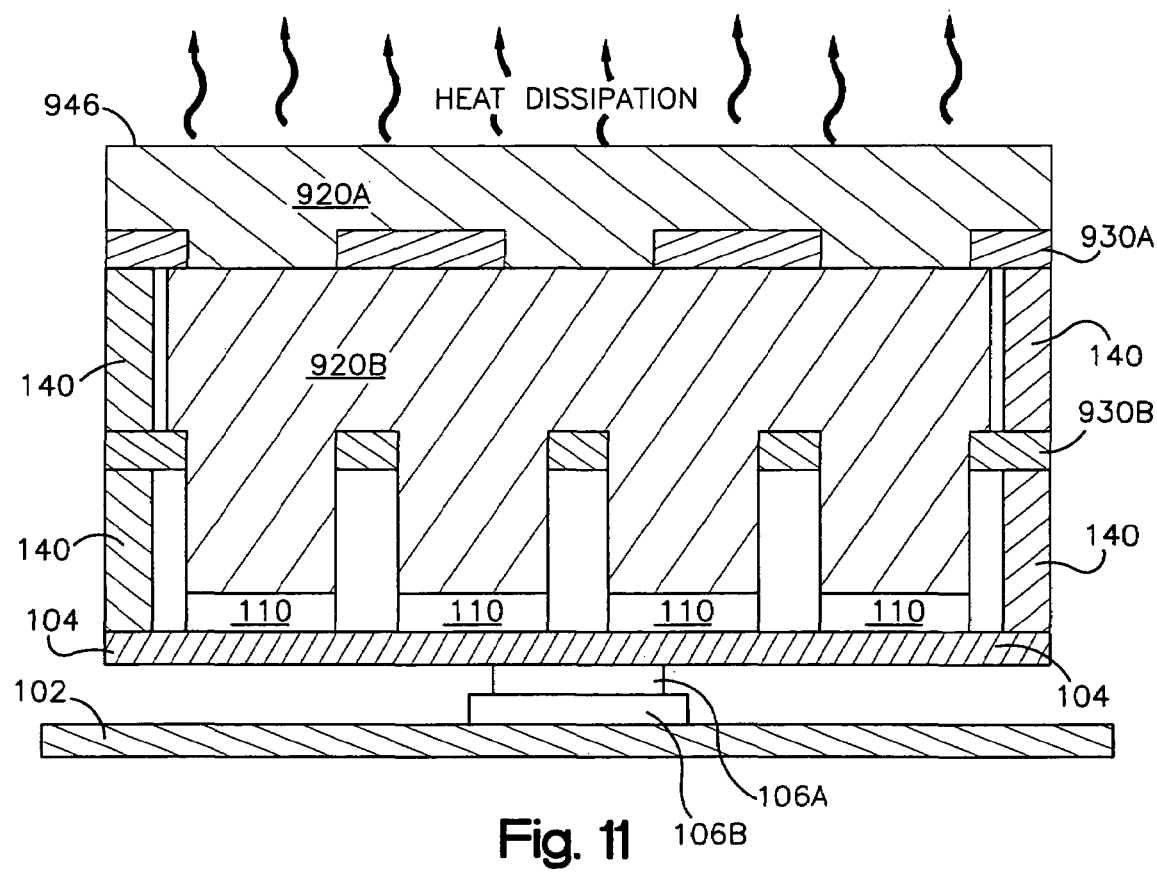
FIG. 11 is a side view of the electronic assembly of FIG. 10 with the electronic assembly being assembled together.

Heat can be conducted or exchanged through plural layers and/or plural modules. This heat can be evacuated or dissipated from a common exit location or common surface area. For example, heat generated by the heat-generating components can be vertically conducted or transferred through the power systems and heat dissipation devices and thereafter dissipated into the air or environment at a top surface of the electronic assembly. FIGS. 9–11 show an exemplary embodiment for conducting and dissipating heat in accordance with embodiments of the invention.

As shown in FIGS. 9–11, a PCB 102 connects to a PCB 104 via connectors 106A and 106B. The PCB 104 includes a plurality of heat-generating components 110. A first thermal dissipation device 920A is positioned at an outer surface of the electronic assembly or on top of a first power system 930A. A second thermal dissipation device 920B is sandwiched or positioned between two power systems 930A and 930B.

The power systems 930A, 930B include at least one opening or hole 932. Each hole 932 is adapted or shaped to receive a portion of the thermal dissipation device. In this regard, the thermal dissipation devices 920A, 920B include at least one extension or protrusion 934 that extends outwardly from a body of the thermal dissipation device. The extension 934 is adapted and shaped to fit through a corresponding hole 932.

By way of illustration, thermal dissipation device 920A includes three extensions 934A that extend downwardly from a bottom surface of the thermal dissipation device 920A. The power system 930A has a body with three holes 932A. The three extensions 934A extend through the three holes 932A to contact or abut a top surface 942 of thermal dissipation device 920B. Further, thermal dissipation device 920B includes four extensions 934B that extend downwardly from a bottom surface of the thermal dissipation device 920B. The power system 930B has a body with four holes 932B. The four extensions 934B extend through the four holes 932B to contact or abut top surfaces 944 of heat-generating components 110.

The heat-generating components 110 generate heat. This heat is conducted or transferred from the top surfaces 944, through extensions 934B, through the thermal dissipation device 920B, through extensions 934A, through thermal dissipation device 920A, and dissipated out through a top surface 946 of thermal dissipation device 920A.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural processors, ASICs, memories, and other devices. The first circuit board can be connected to a second circuit board in a vertical stacked-up configuration to create a space between the first and second circuit boards. A first power system can be connected in a vertical stacked-up configuration to the first circuit board. One or more power connectors can couple the first power system to the first circuit board. A first thermal dissipation device is disposed or sandwiched between the first circuit board and the first power system. The first thermal dissipation device thermally dissipates heat away from both the first circuit board and the first power system. A second power system can be connected to the first circuit board and arranged in a vertical stacked-up configuration above the first power system. One or more power connectors can couple the second power system to the first circuit board. A second thermal dissipation device is disposed or sandwiched between the first power system and the second power system. The second thermal dissipation device thermally dissipates heat away from both the first power system and the second power system. The first thermal dissipation device and/or the second thermal dissipation device can be an active device that generates an airflow pathway. The airflow pathway can be directed to any one of or any combination of the first and second circuit boards, the first and second power systems, the first and second thermal dissipation devices, and/or the heat-generating components coupled or attached to a top surface of the first circuit board. Further, the first and second thermal dissipation devices can be similar to or different from each other in size and/or type/kind.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic assembly, comprising:
a first printed circuit board (PCB);
a second PCB having plural processors, the second PCB being coupled to and disposed vertically above the first PCB;
a first power system coupled to and disposed vertically above the second PCB;
a first thermal dissipation device disposed between the first power system and second PCB for dissipating heat away from the processors;
a second power system coupled to and disposed vertically above the first power system; and
a second thermal dissipation device disposed between the first and second power systems for dissipating heat away from both the first and second power systems.

2. The electronic assembly of claim 1 wherein:
the first and second power systems provide power to the second PCB;
the first and second power systems are redundant such that upon failure of the first power system, the second power system can provide power for both power systems.

3. The electronic assembly of claim 1 wherein heat is exchanged directly from the processors to the first thermal dissipation device.

4. The electronic assembly of claim 1 wherein heat is exchanged directly from the first and second power systems to the second thermal dissipation device.

5. The electronic assembly of claim 1 wherein the first and second power systems are removable from and connectable to the second PCB while the first and second PCBs remain connected.

6. The electronic assembly of claim 1 wherein the first and second power systems are power circuit boards that are parallel to the first and second PCBs.

7. The electronic assembly of claim 1 further comprising four different vertically stacked layers that include the first PCB as a first layer, the second PCB as a second layer, the first power system as a third layer, and the second power system as a fourth layer.

8. The electronic assembly of claim 7 wherein the first thermal dissipation device substantially fills a volume of space between the second and third layers, and the second thermal dissipation device substantially fills a volume of space between the third and fourth layers.

9. A method, comprising:
connecting, in a stacked configuration, plural redundant power system boards, such that a space between the power system boards includes a first thermal dissipation device;
connecting, in a stacked configuration, the power systems boards to a module having multiple integrated circuit chips, such that a space between one of the power system boards and the module includes a second thermal dissipation device;
dissipating heat from both power system boards with the first thermal dissipation device; and
dissipating heat from the integrated circuit chips with the second thermal dissipation device.

10. The method of claim 9 further comprising providing sufficient power to the module from one of the power system boards upon failure of the other power system board.

11. The method of claim 9 further comprising:
dissipating heat from the plural power system boards with an airflow generated by the first thermal dissipation device;
dissipating heat from the integrated circuit chips with heat exchange directly from the integrated circuit chips to the second thermal dissipation device.

12. The method of claim 9 further comprising connecting the power system boards and module to a system board so the power system boards, the module, and the system board form a parallel and vertically stacked-up configuration.

13. The method of claim 9 further comprising:
connecting the module and connected power system boards to a system board;
disconnecting one of the power system boards while the module and other power system board remain connected to the system board.

14. The method of claim 9 further comprising:
substantially filling the space between the power system boards with the first thermal dissipation device;
substantially filling the space between one of the power system boards and the module with the second thermal dissipation device.

15. An apparatus, comprising:
a module having plural processors;
a first power system coupled, in a vertically stacked configuration, to the module for providing power to the module;
a second power system for providing power to the module and coupled, in a vertically stacked configuration, to the first power system, wherein each power system serves as a duplicate for preventing failure of the module upon failure of one of the power systems; and
a thermal dissipation device disposed between the first and second power systems and between the first power system and the module, wherein the thermal dissipation device dissipates heat, via heat exchange, away from the plural processors, the first power system, and the second power system.

16. The apparatus of claim 15 wherein:
the first power system has at least one opening;
the thermal dissipation device has at least one protrusion that extends through the opening to contact the processors.

17. The apparatus of claim 15 wherein:
the module further includes a memory and an application specific integrated circuit (ASIC);
the thermal dissipation device dissipates heat, via heat exchange, away from the memory and ASIC;
the memory and ASIC are adjacent the plural processors and under the first power system.

18. The apparatus of claim 15 further comprising a second thermal dissipation device disposed, in a vertically stacked configuration, above the second power system, wherein heat generated from the processors conducts through both thermal dissipation devices and exits from a surface of the second thermal dissipation device.

19. The apparatus of claim 18 wherein the first and second power systems include plural openings for receiving a portion of the thermal dissipation device.

20. The apparatus of claim 15 wherein heat generated from the processors is conducted through openings in the first and second power systems and dissipated from a surface of the thermal dissipation device.

* * * * *